United States Patent
He et al.

(10) Patent No.: US 12,406,712 B2
(45) Date of Patent: Sep. 2, 2025

(54) SENSING SCHEME FOR A MEMORY WITH SHARED SENSE COMPONENTS

(71) Applicant: Micron Technology, Inc., Boise, ID (US)

(72) Inventors: Yuan He, Boise, ID (US); Tae H. Kim, Boise, ID (US); Scott James Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/581,260

(22) Filed: Feb. 19, 2024

(65) Prior Publication Data

US 2024/0274180 A1    Aug. 15, 2024

Related U.S. Application Data

(63) Continuation of application No. 18/048,738, filed on Oct. 21, 2022, now Pat. No. 11,915,735, which is a continuation of application No. 17/171,873, filed on Feb. 9, 2021, now Pat. No. 11,501,815.

(51) Int. Cl.
    *G11C 11/22*    (2006.01)

(52) U.S. Cl.
    CPC ........ *G11C 11/2273* (2013.01); *G11C 11/221* (2013.01); *G11C 11/2255* (2013.01); *G11C 11/2257* (2013.01)

(58) Field of Classification Search
    CPC ............. G11C 11/2273; G11C 11/221; G11C 11/2255; G11C 11/2257
    See application file for complete search history.

(56) References Cited

U.S. PATENT DOCUMENTS

| | | |
|---|---|---|
| 9,715,918 B1 | 7/2017 | Kawamura |
| 10,770,125 B2 | 9/2020 | Johnson |
| 2004/0008543 A1 | 1/2004 | Kato |
| 2004/0145959 A1 | 7/2004 | Kuge et al. |
| 2005/0180222 A1 | 8/2005 | Suzuki |

(Continued)

FOREIGN PATENT DOCUMENTS

| | | |
|---|---|---|
| KR | 10-0576488 B1 | 5/2006 |
| KR | 10-2010-0052907 A | 5/2010 |

OTHER PUBLICATIONS

"International Search Report and Written Opinion of the International Searching Authority," issued in connection with Int'l Appl. No. PCT/US22/70369, dated May 11, 2022 (9 pages).

*Primary Examiner* — Han Yang
(74) *Attorney, Agent, or Firm* — Holland & Hart LLP

(57) ABSTRACT

Methods, systems, and devices for sensing a memory with shared sense components are described. A device may activate a word line and a plate line each coupled with a set of memory cells, where each memory cell of the set of memory cells is coupled with a respective digit line of a set of digit lines. The device may activate a set of switching components to couple each digit line of the set of digit lines with a respective sense component of a set of sense components, where each switching component of the set of switching components is coupled with a respective memory cell of the set of memory cells. The device may sense the set of memory cells based on activating the word line and the plate line and based on coupling the set of digit lines with the set of sense components.

20 Claims, 6 Drawing Sheets

(56) References Cited

U.S. PATENT DOCUMENTS

| | | |
|---|---|---|
| 2008/0082730 A1* | 4/2008 | Kim .................... G06F 11/1068 |
| | | 711/E12.008 |
| 2009/0225594 A1 | 9/2009 | Choi et al. |
| 2011/0261606 A1 | 10/2011 | Sandhu et al. |
| 2012/0195145 A1 | 8/2012 | Kobayashi |
| 2014/0286081 A1 | 9/2014 | Takahashi et al. |
| 2015/0364178 A1 | 12/2015 | Kim et al. |
| 2017/0358338 A1 | 12/2017 | Derner et al. |
| 2019/0189179 A1 | 6/2019 | Kawamura |

* cited by examiner

SENSING SCHEME FOR A MEMORY WITH SHARED SENSE COMPONENTS

CROSS REFERENCES

The present application for patent is a Continuation of U.S. patent application Ser. No. 18/048,738 by He et al., entitled "SENSING SCHEME FOR A MEMORY WITH SHARED SENSE COMPONENTS," filed Oct. 21, 2022, which is a Continuation of U.S. patent application Ser. No. 17/171,873 by He et al., entitled "SENSING SCHEME FOR A MEMORY WITH SHARED SENSE COMPONENTS," filed Feb. 9, 2021, each of which is assigned to assignee hereof, and each of which is expressly by reference in its entirety herein.

FIELD OF TECHNOLOGY

The following relates generally to one or more systems for memory and more specifically to sensing scheme for a memory with shared sense components.

BACKGROUND

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

A memory device may include a memory die with one or more arrays that may include multiple tiers of memory cells stacked above (e.g., on top of) each other. To sense the memory cells in the array, the memory device may activate the word lines associated with the memory cells so that a voltage indicative of a logic state develops on the respective digit lines of the memory cells. The memory device may then use sense components to sense the voltages on the digit lines, which may allow the memory device to determine the corresponding logic states. Each digit line may be coupled with a respective sense component (e.g., so that multiple memory cells can be sensed in parallel), which means that in some examples there may be as many sense components as digit lines. But sense components may be relatively large components compared to other types of components so, having a sense component for each digit line may reduce a capacity of the memory die (or alternatively increase the size of the memory die) relative to other architectures, among other disadvantages.

According to the techniques described herein, the capacity of a memory die may be increased, or the size of the memory die may be decreased, among other advantages, relative to other architectures by using an architecture in which multiple digit lines in a group, such as a tier, are coupled with a single sense component for that group. Thus, the quantity of sense components may match (e.g., correspond to) the quantity of tiers in the array, as opposed to matching (e.g., corresponding to) the quantity of digit lines in the array (which may be a multiple of the quantity of tiers). To accommodate such an architecture, the memory device may include components, such as switching components (e.g., multiplexors, transistors) positioned electrically between the digit lines and the sense components. Additionally or alternatively, the memory device may use a rotating sensing scheme in which the memory cells coupled with different word lines are sensed at different times.

Features of the disclosure are initially described in the context of systems and dies as described with reference to FIGS. 1 and 2. Features of the disclosure are described in the context of a device and a timing diagram as described with reference to FIGS. 3 and 4. These and other features of the disclosure are further illustrated by and described with reference to an apparatus diagram and a flowchart that relate to a sensing scheme for a memory with shared sense components as described with reference to FIGS. 5 and 6.

Figure 1:
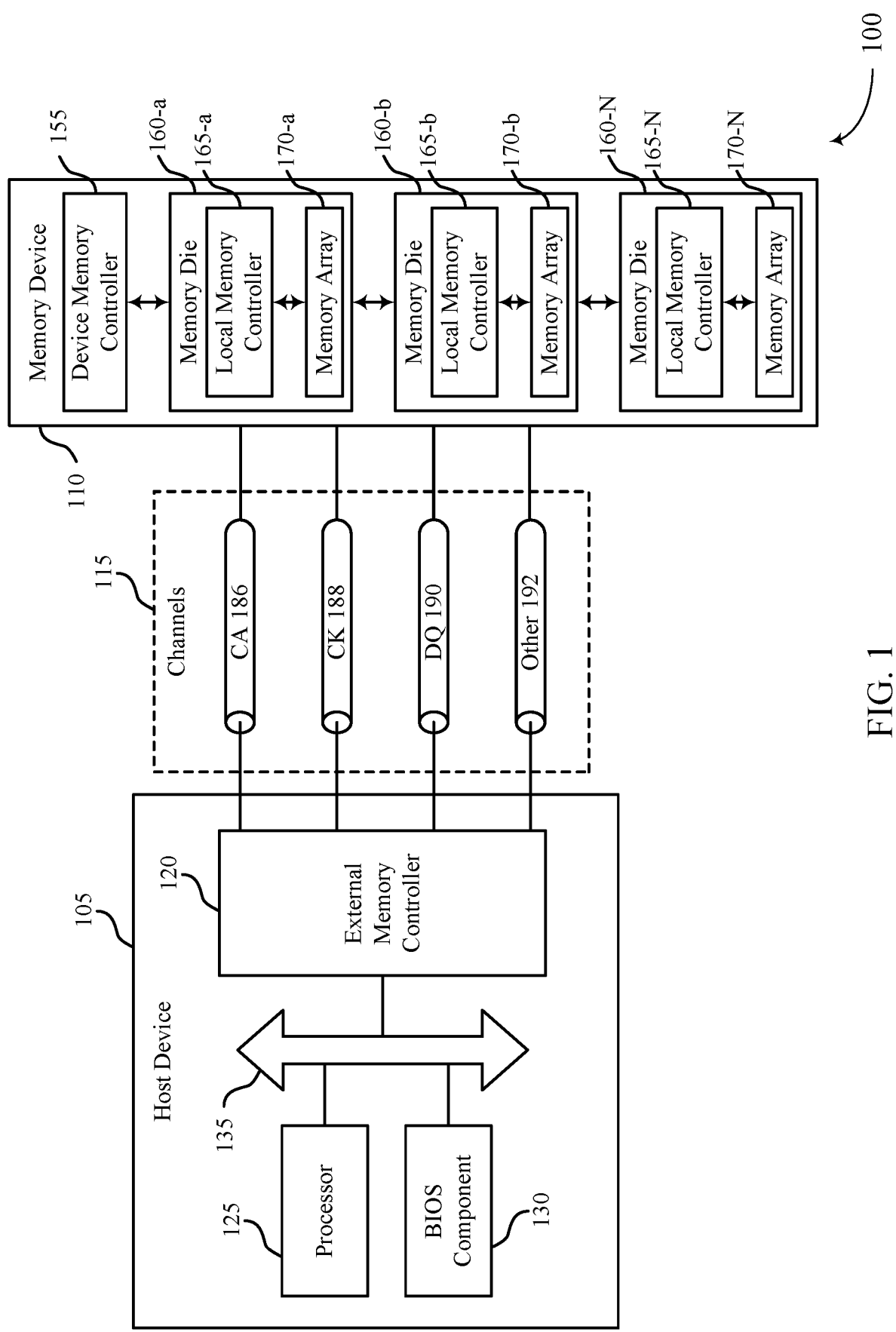
FIG. 1 illustrates an example of a system that supports a sensing scheme for a memory with shared sense components in accordance with examples as disclosed herein.

FIG. 1 illustrates an example of a system 100 that supports a sensing scheme for a memory with shared sense components in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a memory array 170 may include multiple (e.g., y) stacked tiers of memory cells. Each tier may include multiple (e.g., x) digit lines each of which is coupled with a respective sense component for sensing memory cells associated with that digit line. So the quantity of sense components may be equal to the quantity of digit lines in the memory array 170 (e.g., the quantity of sense components may be equal to y×x). Due to the relatively large sizes of the sense components, the sense components may consume relatively large areas of the memory die 160 on which the memory array 170 is disposed. Thus, using these other different techniques the memory die 160 may be inefficiently used or undesirably sized.

In contrast, according to the techniques described herein, the efficiency of a memory die 160 may be improved (or the size of the memory die 160 may be reduced, or both, among other advantages) by configuring the memory array 170 with a single sense component per tier. Thus, the quantity of sense components may be reduced from y Xx (the quantity of digit lines) to y (the quantity of tiers), which may, relative to other configurations, conserve space on the memory die 160 for other components (or allow the size of the memory die 160 to be reduced), among other benefits.

Figure 2:
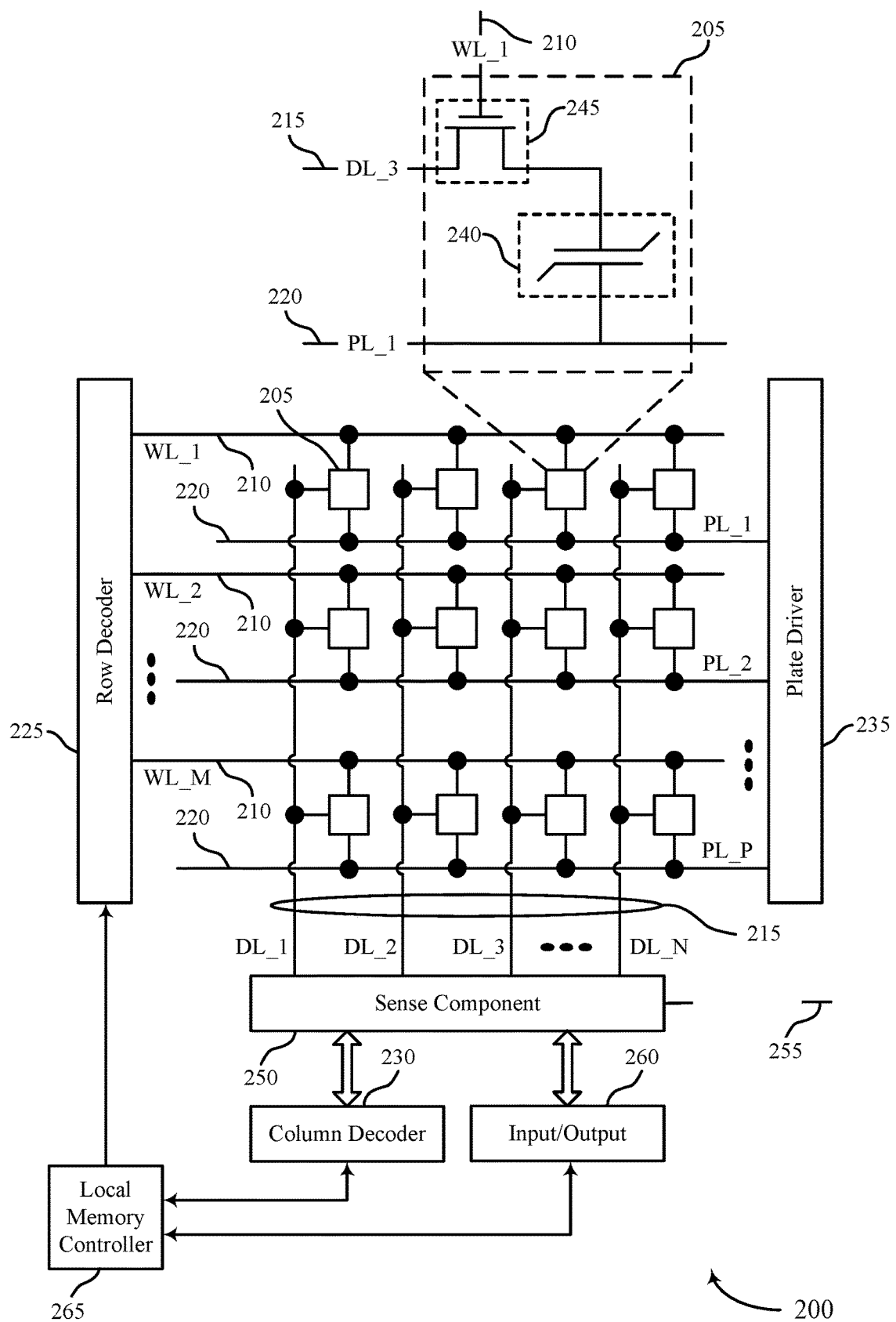
FIG. 2 illustrates an example of a memory die that supports a sensing scheme for a memory with shared sense components in accordance with examples as disclosed herein.

FIG. 2 illustrates an example of a memory die 200 that supports a sensing scheme for a memory with shared sense components in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, the memory cells 205 of the memory die 200 may be arranged in tiers to form a stack of memory cells (e.g., to increase the capacity of the memory die 200). Each tier may include multiple sets of memory cells each of which is coupled with a respective digit line. When such a configuration is used for these other different techniques, each digit line in a tier may be coupled with a respective sense component to enable sensing (or, put another way, each vertical word line may be coupled with quantity of sense components equal to the number of tiers). Thus, there may be a one-to-one correspondence between digit lines and sense components using these other different techniques. But inclusion of a sense component per digit line may reduce the efficiency of the memory die 200. According to the techniques described herein, in contrast the efficiency of the memory die 200 may be increased by using a configuration that couples the digit lines in a tier with a single sense component (e.g., so that the sense component is coupled with multiple vertical word lines). Thus, the sense component may be "shared" by or "common" to the digit lines in the tier (or, put another way, shared by multiple vertical word lines).

According to the techniques described herein, to facilitate sensing, each digit line may be coupled with a respective switching component that may be couplable with (e.g., may be configured to selectively couple) that digit line with the sense component shared by other digit lines in the tier. Although this means that there may be as many switching components as digit lines, such a configuration may be more efficient than having as many sensing components as digit lines at least because switching components may be smaller than sensing components, among other advantages. Thus, the efficiency of the memory die 200 may be improved relative to other different configurations, such as those that include a sense component for every digit line.

Figure 3:
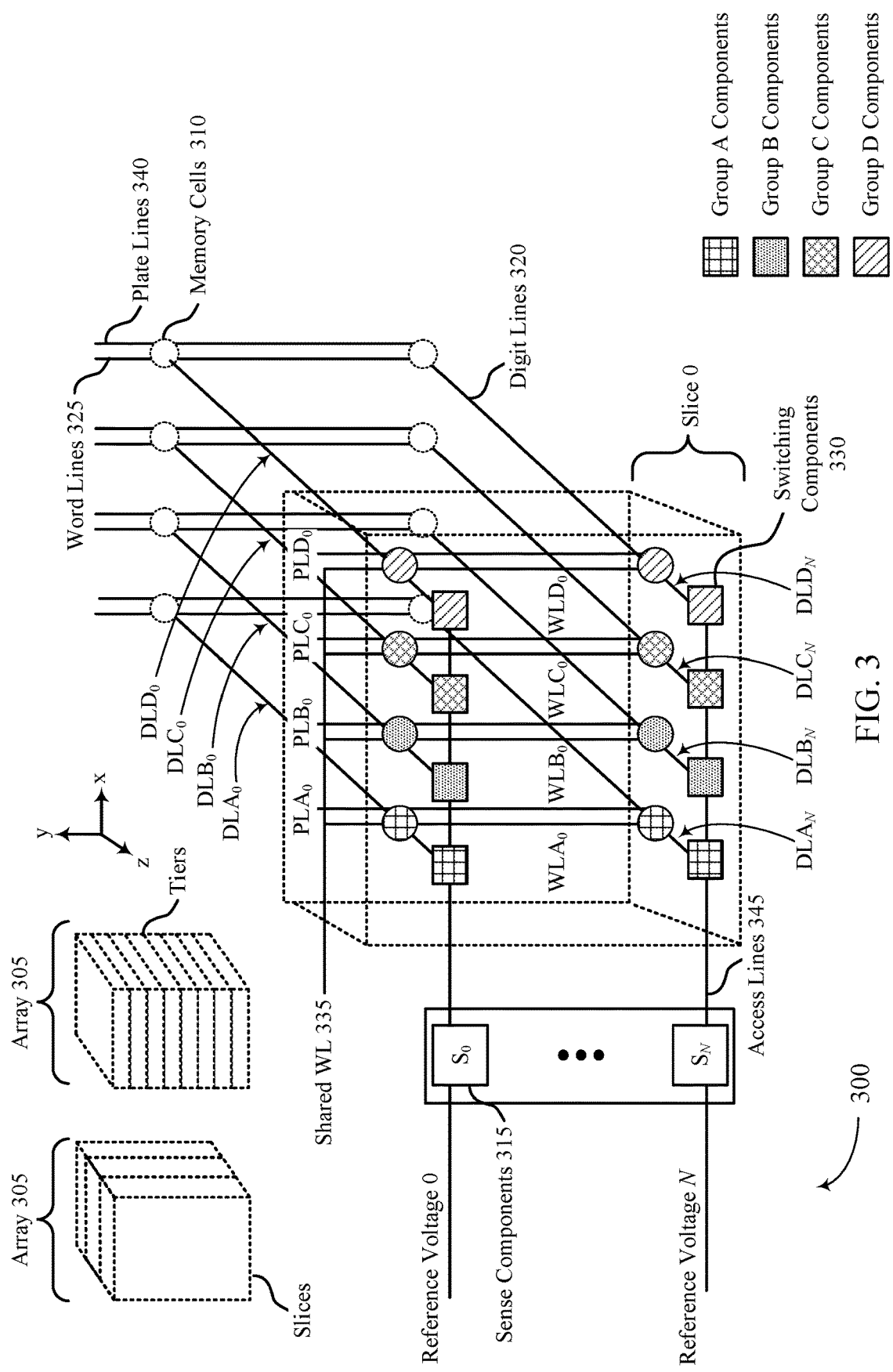
FIG. 3 illustrates an example of a device that supports a sensing scheme for a memory with shared sense components in accordance with examples as disclosed herein.

FIG. 3 illustrates an example of a device that supports a sensing scheme for a memory with shared sense components in accordance with examples as disclosed herein. The device 300 may be an example of a system 100, a memory device 110, or a memory die 160 as described with reference to FIG. 1, or an example of a memory die 200 as described with reference to FIG. 2. The device 300 may include an array 305, which may include memory cells 310 stacked on top of each other and next to each other. The array 305 may be conceptually divided into tiers and slices, where in some examples each tier may encompass a single layer of memory cells distributed in the x-z plane and in some examples each slice may encompass a single layer of memory cells distributed in the x-y plane. Other various configurations and options for dividing the array, into subsets, groups, tiers, slices, etc. are also within the scope of the present disclosure. To increase the efficiency of the device 300, the memory cells in a tier may be coupled with a single sense component 315. Thus, the device 300 may include one sense component 315 per tier, as opposed to one sense component per digit line, which may save space on the memory die that includes the array 305, among other advantages. Although shown and described with a single sense component 315 per tier, multiple sense components per tier may also be implemented in some examples.

For case of illustration, only a single slice (slice 0) at the front of the array 305 is shown in detail. However, other slices of the array 305 may be at least somewhat similarly configured.

The memory cells 310 in a tier may include multiple sets of memory cells each coupled with a respective digit line (DL) 320 that spans one or more slices. For example, the memory cells in the lowest tier of the array 305 (e.g., tier N) may be coupled with digit lines $DLA_N$ through $DLD_N$. Similarly, the memory cells in the highest tier of the array 305 (e.g., tier 0) may be coupled with digit lines $DLA_0$ through $DLD_0$, and so on and so forth for the other tiers in the array 305. Each memory cell 310 in the array 305 may be coupled with a respective switching component (or "selection component"), such as the switching component 245, that is configured to selectively couple that memory cell 310 with the digit line 320 associated with that memory cell 310. Put another way, the selection component may be configured to electrically isolate the memory cell from the digit line when deactivated and may be configured to provide a conductive path between the memory cell and the digit line when activated. The selection component of a memory cell may be controlled (e.g., activated, deactivated) by the word line (WL) 325 coupled with that memory cell 310.

To save space, among other advantages, the device 300 may include a sense component for at least some tiers if not each tier (as opposed to a sense component for each digit line, or other configuration). Thus, some or all of the digit lines in a tier may be coupled with a respective sense component for that tier. As an example, the digit lines in the lowest tier (e.g., tier N) may be coupled with sense component $S_N$, the digit lines in the highest tier (e.g., tier 0) may be coupled with sense component $S_0$, and so on and so forth for at least some of if not all of the other tiers of the array 305.

To reduce capacitive effects that may negatively impact sensing, among other reasons, the device 300 may include switching components 330 that are configured to selectively couple the digit lines 320 with the sense components 315. Put another way, a switching component 330 that is coupled with a digit line 320 and a sense component 315 may be configured to electrically isolate the digit line 320 from the sense component 315 when deactivated and may be configured to provide a conductive path between the digit line 320 and the sense component 315 when activated. If the digit lines 320 have non-negligible capacitances, inclusion of the switching components 330 may allow the device 300 to avoid deleterious effects of parasitic capacitance by isolating unselected digit lines from a sense component during sensing of a selected digit line. The switching components 330 may be transistors, multiplexors, switches, or other components capable of selectively isolating and coupling the digit lines 320 and the sense components 315.

The memory cells 310 in a slice may include multiple sets of memory cells each coupled with a respective word line and a respective plate line (PL) 340 and spanning multiple tiers. For example, the memory cells in the nearest slice of the array 305 (e.g., slice 0) may be coupled with word lines $WLA_0$ through $WLD_0$ and plate lines $PLA_0$ through $PLD_0$. Similarly, the memory cells in the farthest tier of the array 305 (e.g., tier N) may be coupled with word lines $WLA_N$ through $WLD_N$). And so on and so forth for the other slices in the array 305. As noted, the word lines 325 in a slice may control the selection components of the memory cells 310 in that slice.

Within in a slice, a set of memory cells 310 that shares a word line and plate line may be referred to as a group. For example, in slice 0, Group A may include the memory cells coupled with $WLA_0$ and $PLA_0$, Group B may include the memory cells coupled with $WLB_0$ and $PLB_0$, Group C may include the memory cells coupled with $WLC_0$ and $PLC_0$, and Group D may include the memory cells coupled with $WLD_0$ and $PLD_0$. Components associated with a same group of memory cells are shown in FIG. 3 shaded with the same pattern.

To accommodate the shared sense components 315, the memory cells 310 in a slice may be sensed by using a rotating sensing scheme in which the groups of memory cells may be sensed at different times. For example, referring to slice 0, the memory cells in Group A may be sensed first, followed by the memory cells in Group B, followed by the memory cells in Group C, followed by the memory cells in Group D. A sense component 315 may sense the logic state of a memory cell by comparing the voltage of the digit line with a reference voltage. So, each sense component 315 may be configured to receive a respective reference voltage (e.g., sense component $S_0$ may be configured to receive reference voltage 0, sense component $S_N$ may be configured to receive reference voltage N, and so on and so forth). After the memory cells 310 in one slice are sensed, the process may repeat for the memory cells 310 in another slice. Additionally or alternatively, a subset of memory cells 310 in a first slice may be sensed using the rotating sensing scheme, then a subset of memory cells 310 in a second slice may be sensed using the rotating sensing scheme, and then another subset of memory cells 310 in the first slice may be sensed using the rotating sensing scheme.

As will be explained in more detail with respect to FIG. 4, sensing a group of memory cells may involve activating the word line and plate line for that group so that a voltage indicative of a logic state develops on each digit line associated with that group. Additionally, the switching components 330 associated with the group may be activated so that each digit line is coupled with a respective sense component (which allows the digit line to charge share with the access line 345 of that sense component 315). During a sensing operation for a group, the switching components 330 of the other groups may be deactivated (e.g., turned off) so that the capacitances of the digit lines in the other groups do not affect the sensing operation, among other reasons.

In some examples, the word lines 325 in a slice may be coupled with a shared (or "global") word line 335 so that the word lines 325 can be controlled as a set. The shared word line 335 may be a conductive line that is coupled with multiple word lines 325 in a slice and that activates and deactivates those word lines 325 collectively. In some examples, the shared word line 335 is coupled with a shared word line driver (SWD) that is configured to drive multiple word lines concurrently or at overlapping times. The shared word line driver may be disposed below the array 305 and may be within the footprint of the array 305 or outside of the footprint of the array 305. Alternatively, each word line 325 in a slice may be isolated from the other word lines in the slice and may be driven by a respective word line driver. In such an example, the word lines 325 may be controlled (e.g., activated, deactivated) independently and the word line drivers may be disposed below the array 305, either within or outside of the footprint of the array 305. Thus, the described configuration of device 300 may be used with different types of word line architectures.

Although shown with particular quantities of components (e.g., four word lines per slice), other quantities of corresponding components are contemplated in various additional or alternative examples.

Figure 4:
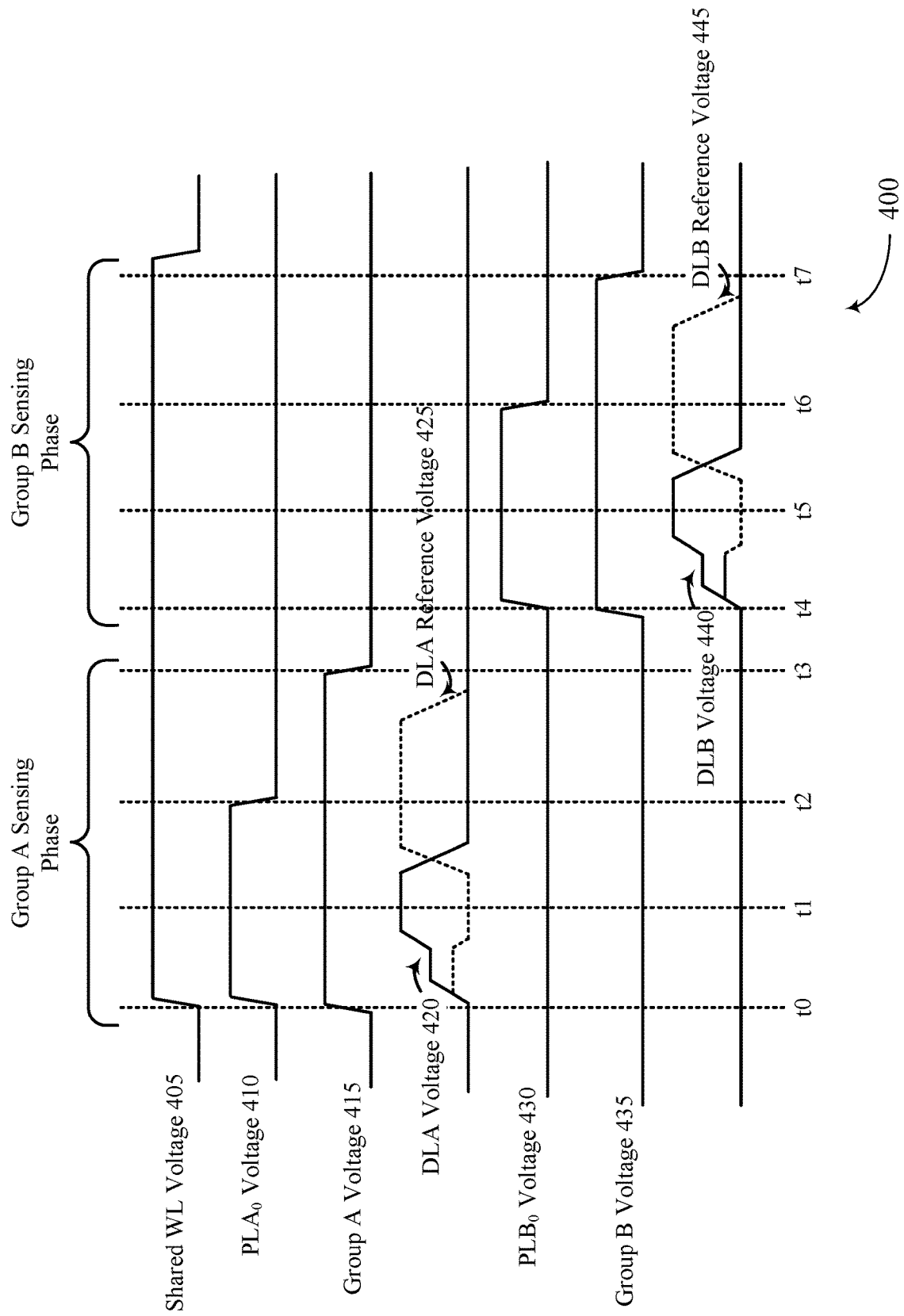
FIG. 4 illustrates an example of a timing diagram that supports a sensing scheme for a memory with shared sense components in accordance with examples as disclosed herein.

FIG. 4 illustrates an example of a timing diagram 400 that supports a sensing scheme for a memory with shared sense components in accordance with examples as disclosed herein. The timing diagram 400 illustrates the voltages of various components of the device 300 during at least a portion of a rotating sensing operation. The rotating sensing operation may allow the device 300 to sense the logic states of different groups of memory cells in the array 305, which is configured with a single sense component per tier (as opposed to a single sense component per digit line, or other configuration).

The timing diagram 400 illustrates the voltage applied to the shared word line 335, denoted shared WL voltage 405. With respect to Group A, the timing diagram illustrates: the voltage applied to plate line $A_0$, denoted $PLA_0$ voltage 410; the voltage applied to the switching components 330 for Group A, denoted Group A voltage 415; the voltage on the digit lines 320 for Group A, denoted DLA voltage 420; and the reference voltages for the digit lines of group A, denoted DLA reference voltage 425. With respect to Group B, the timing diagram illustrates: the voltage applied to plate line $B_0$, denoted $PLB_0$ voltage 430; the voltage applied to the switching components 330 for Group B, denoted Group B voltage 435; the voltage on the digit lines 320 for Group B, denoted DLB voltage 440; and the reference voltages for the digit lines of group B, denoted DLB reference voltage 445. The reference voltages for the digit line in Group A and the reference voltages for the digit line in Group B may be based on the reference voltages 0 through N in FIG. 3.

The timing diagram 400 illustrates the various listed voltages during sensing of Group A (referred to as the Group A sensing phase) and during sensing of Group B (referred to as the Group B sensing phase). According to the rotating sensing scheme, in some examples the Group B sensing phase may occur after the Group A sensing phase.

In brief, during the Group A sensing phase, the shared word line 335 and the plate line $A_0$, may be activated so that the memory cells in Group A discharge onto the digit lines $A_0$ through $A_N$. Also, the switching components 330 for Group A may activated so that the digit lines $A_0$ through $A_N$ are coupled with the sense components 315 (allowing the voltages on the digit lines to develop on the input access lines 345 of the sense components 315). During the Group A sensing phase, the plates lines of the other groups (including the plate line B0) may be deactivated and the switching components 330 for the other groups (including Group B) may be deactivated, which may prevent the capacitances of the digit lines in the other groups from negatively impacting the sensing operation for Group A, among other advantages.

Reference is now made with greater detail to the timing diagram 400. At or around time t0, the shared word line 335, the plate line $A_0$, and the switching components 330 may be activated. Thus, the memory cells in Group A may charge share with the digit lines $DLA_0$ through $DLA_N$, and the digit lines $DLA_0$ through $DLA_N$ may charge share with the access lines 345 of the sense components $S_0$ through $S_N$. Although shown simultaneously (e.g., at the same time), the operations at time to may occur concurrently (e.g., at partially overlapping times, slightly offset in time, within a threshold amount of time of each other).

Activating a word line (e.g., a shared word line 335 or a word line 325) may refer to applying a sufficient voltage to that word line (e.g., increasing the shared word line voltage 405 to a threshold level) so that the selection component(s) coupled with the word line are activated (e.g., turned on so that a conductive path or channel is established through the selection components). Activating the shared word line 335 may activate the word lines 325 coupled with the shared word line 335, such as the word lines for Group A through Group D. Activating a plate line 340 may in some examples refer to applying a sufficient voltage to that plate line (e.g., increasing the $PLA_0$ voltage 410 to a threshold level) so that the memory cell coupled with the plate line discharges onto the digit line associated with that memory cell. Activating a switching component 330 may in some examples refer to applying a sufficient voltage to the gate (or other control terminal) of the switching component 330 so that a conductive path or channel is established through the switching component. So, the switching components 330 in Group A may be activated by increasing the Group A voltage 415 to a threshold level.

Based on activating the shared word line 335, the plate line $A_0$, and the switching components 330 for Group A, a voltage indicative of a logic state may develop on each of the digit lines $DLA_0$ through $DLA_N$. To sense the logic states, the sense components $S_0$ through $S_N$ may compare the digit line voltages (e.g., DLA voltages 420) to respective reference voltages (e.g., DLA reference voltages 425). In some examples, the comparison of a digit line voltage and a reference voltage may pull the digit line voltage and the reference voltage to opposite voltage rails or threshold voltages (e.g., to increase the sense window), as shown in FIG. 4. At time t1 (e.g., after the DLA voltage 420 and the DLA reference voltage 425 have reached an equilibrium for a threshold duration), the sense components 315 may sense the logic states of the memory cells 310 in Group A.

After sensing the memory cells in Group A, the plate line $A_0$ and the switching components 330 for Group A may be deactivated so that a new group of memory cells (e.g., Group B) can be sensed using the shared sense components 315. For example, the plate line $A_0$ may be deactivated at time t2 and the switching components 330 for Group A may be deactivated at time t3. Deactivating a plate line 340 may refer to reducing the voltage applied to the plate line to a threshold level. So, $PLA_0$ may be deactivated by reducing the $PLA_0$ voltage 410 to a threshold level. Deactivating a switching component 330 may refer to reducing the voltage applied to the gate (or other control terminal) of the switching component 330 so that the conductive path or channel through the switching component is cutoff. As an example, the switching components in Group A may be deactivated by reducing the Group A voltage 415 to a threshold level. The Group A sensing phase may conclude after time t3.

As noted, the memory cells from Group B may be sensed after the memory cells from Group A. In brief, during the Group B sensing phase, the shared word line 335 and the plate line $B_0$, may be activated so that the memory cells in Group B discharge onto the digit lines $B_0$ through $B_N$. Also, the switching components 330 for Group B may activated so that the digit lines $B_0$ through By are coupled with the sense components 315 (allowing the voltages on the digit lines to develop on the input access lines 345 of the sense components 315). During the Group B sensing phase, the plates lines of the other groups (including the plate line $A_0$) may be deactivated and the switching components 330 for the other groups (including Group A) may be deactivated, which may prevent the capacitances of the digit lines in the other groups from negatively impacting the sensing operation for Group B, among other advantages.

Reference is now made with greater detail to the timing diagram 400. At or around time t4, the plate line $B_0$ and the switching components 330 may be activated (note that $WLB_0$ may already be activated if a shared word line is used and activated, as shown in FIG. 4). Thus, the memory cells in Group B may charge share with the digit lines $DLB_0$ through $DLB_N$, and the digit lines $DLB_0$ through $DLB_N$ may charge share with the access lines 345 of the sense components $S_0$ through $S_N$. Activating the plate line $B_0$ may include increasing the $PLB_0$ voltage 430 to a threshold level and activating the switching components for Group B may include increasing the group B voltage 435 to a threshold level. Although shown concurrently (e.g., at the same time, at partially overlapping times), the operations at time t4 may occur slightly offset in time (e.g., within a threshold amount of time).

Based on activating the plate line $B_0$ and the switching components 330 for Group B, a voltage indicative of a logic state may develop on each of the digit lines $DLB_0$ through $DLB_N$. To sense the logic states, the sense components $S_0$ through $S_N$ may compare the digit line voltages (e.g., DLB voltages 440) to respective reference voltages (e.g., DLB reference voltages 445). In some examples, the comparison of a digit line voltage and a reference voltage may pull the digit line voltage and the reference voltage to opposite voltage rails or threshold voltages (e.g., to increase the sense window), as shown in FIG. 4. At time t5 (e.g., after the DLB voltage 440 and the DLB reference voltage 445 have reached an equilibrium for a threshold duration), the sense components 315 may sense the logic states of the memory cells 310 in Group B.

After sensing the memory cells in Group B, the plate line $B_0$ and the switching components 330 for Group B may be deactivated so that a new group of memory cells (e.g., Group C) can be sensed using the shared sense components 315. For example, the plate line $B_0$ may be deactivated at time t6 and the switching components 330 for Group B may be deactivated at time t7. The plate line $B_0$ may be deactivated by reducing the $PLB_0$ voltage 430 to a threshold level and the switching components 330 in Group B may be deactivated by reducing the Group B voltage 435 to a threshold level. The Group B sensing phase may conclude after time t7. Thus, a rotating sensing scheme may be used to sense the memory cells 310 in array 305 on a group-by-group basis. Although described with reference to two groups (Group A and Group B), the rotating sensing scheme may be used with any quantity of groups.

Although described with reference to a shared word line 335 (and a shared word line voltage 405), in some examples, the rotating sensing scheme may be used with individual word lines 325 that are not coupled with a shared word line 335. Rather, the word lines 325 may be independently activated (e.g., using respective word line drivers). In such an example, the sensing phase for Group A may include activating $WLA_0$ at time to (e.g., while the other word lines (including $WLB_0$) are maintained in an inactive state) and deactivating $WLA_0$ at time t3. Additionally, the sensing phase for Group B may include activating $WLB_0$ at time t4 (e.g., while the other word lines (including $WLA_0$) are maintained in an inactive state) and deactivating $WLB_0$ at time t6. Use of a shared word line may reduce operation or circuit complexity, whereas use of individual word lines may reduce power consumption, among other advantages.

Alternative examples of the foregoing may be implemented, where some operations are performed in a different order than described, are performed in parallel, or are not performed at all. In some cases, operations may include additional features not mentioned below, or further operations may be added. Additionally, certain operations may be performed multiple times or certain combinations of operations may repeat or cycle.

Figure 5:
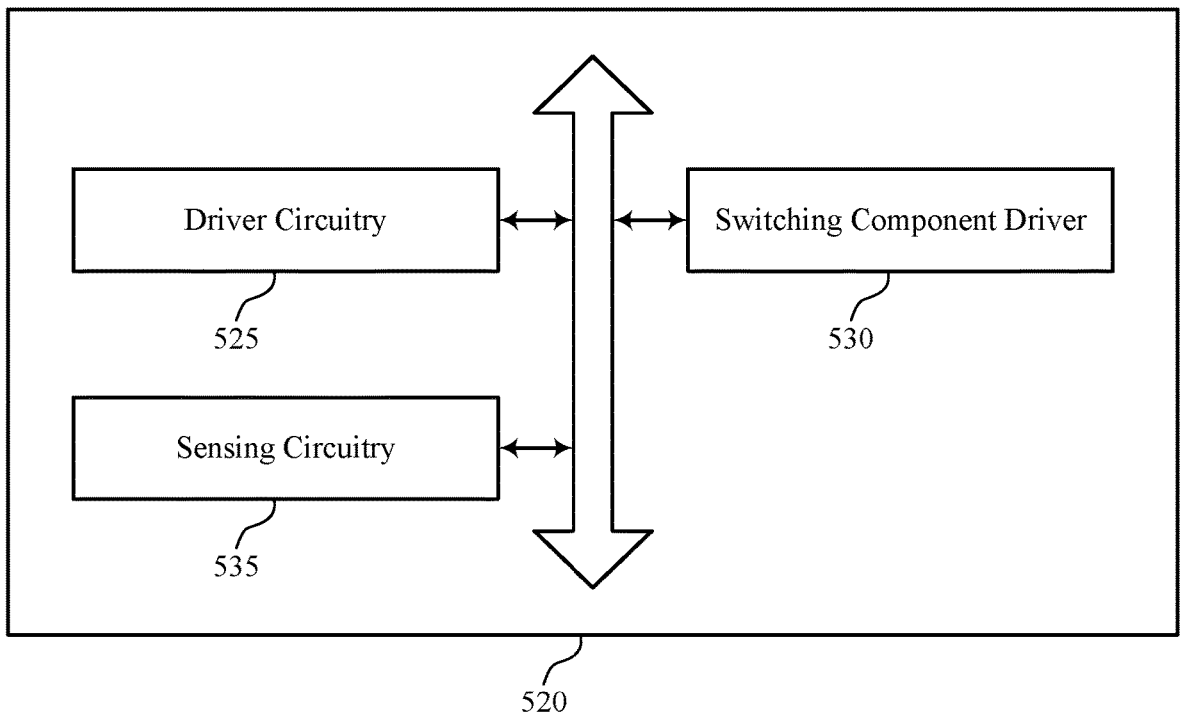
FIG. 5 shows a block diagram of a device that supports a sensing scheme for a memory with shared sense components in accordance with examples as disclosed herein.

FIG. 5 shows a block diagram 500 of a device 520 that supports a sensing scheme for a memory with shared sense components in accordance with examples as disclosed herein. The device 520 may be an example of aspects of a device as described with reference to FIGS. 1 through 4. The device 520, or various components thereof, may be an example of means for performing various aspects of sensing scheme for a memory with shared sense components as described herein. For example, the device 520 may include a driver circuitry 525, a switching component driver 530, a sensing circuitry 535, or any combination thereof. Each of these components may communicate, directly or indirectly, with one another (e.g., via one or more buses).

The driver circuitry 525 may be configured as or otherwise support a means for activating a word line and a plate line each coupled with a set of memory cells, where each memory cell of the set of memory cells is coupled with a respective digit line of a set of digit lines. The switching component driver 530 may be configured as or otherwise support a means for activating a set of switching components to couple each digit line of the set of digit lines with a respective sense component of a set of sense components, where each switching component of the set of switching components is coupled with a respective memory cell of the set of memory cells. The sensing circuitry 535 may be configured as or otherwise support a means for sensing the set of memory cells based at least in part on activating the word line and the plate line and based on coupling the set of digit lines with the set of sense components.

In some examples, the set of switching components is activated concurrent with activating the word line and the plate line.

In some examples, the switching component driver 530 may be configured as or otherwise support a means for deactivating the set of switching components to isolate the set of digit lines from the set of sense components based at least in part on sensing the set of memory cells. In some examples, the driver circuitry 525 may be configured as or otherwise support a means for deactivating the plate line before deactivating the set of switching components.

In some examples, the set of switching components is deactivated after sensing the set of memory cells, and the driver circuitry 525 may be configured as or otherwise support a means for activating, after deactivating the set of switching components, a second plate line coupled with a second set of memory cells, where each memory cell of the second set of memory cells is coupled with a respective digit line of a second set of digit lines. In some examples, the set of switching components is deactivated after sensing the set of memory cells, and the switching component driver 530 may be configured as or otherwise support a means for activating a second set of switching components to couple each digit line of the second set of digit lines with a respective sense component of the set of sense components.

In some examples, the driver circuitry 525 may be configured as or otherwise support a means for activating a second word line coupled with the second set of memory cells concurrent with activating the word line coupled with the set of memory cells.

In some examples, the driver circuitry 525 may be configured as or otherwise support a means for activating a second word line coupled with the second set of memory cells after activating the word line coupled with the set of memory cells.

In some examples, the switching component driver 530 may be configured as or otherwise support a means for deactivating the second set of switching components to isolate the second set of digit lines from the set of sense components based at least in part on sensing the second set of memory cells. In some examples, the driver circuitry 525 may be configured as or otherwise support a means for deactivating the second plate line before deactivating the second set of switching components.

In some examples, the switching component driver 530 may be configured as or otherwise support a means for activating, based at least in part on activating the word line, a second set of switching components coupled with the set of memory cells, where each activated switching component in the second set of switching components couples a respective memory cell of the set of memory cells with a respective digit line of the set of digit lines.

Figure 6:
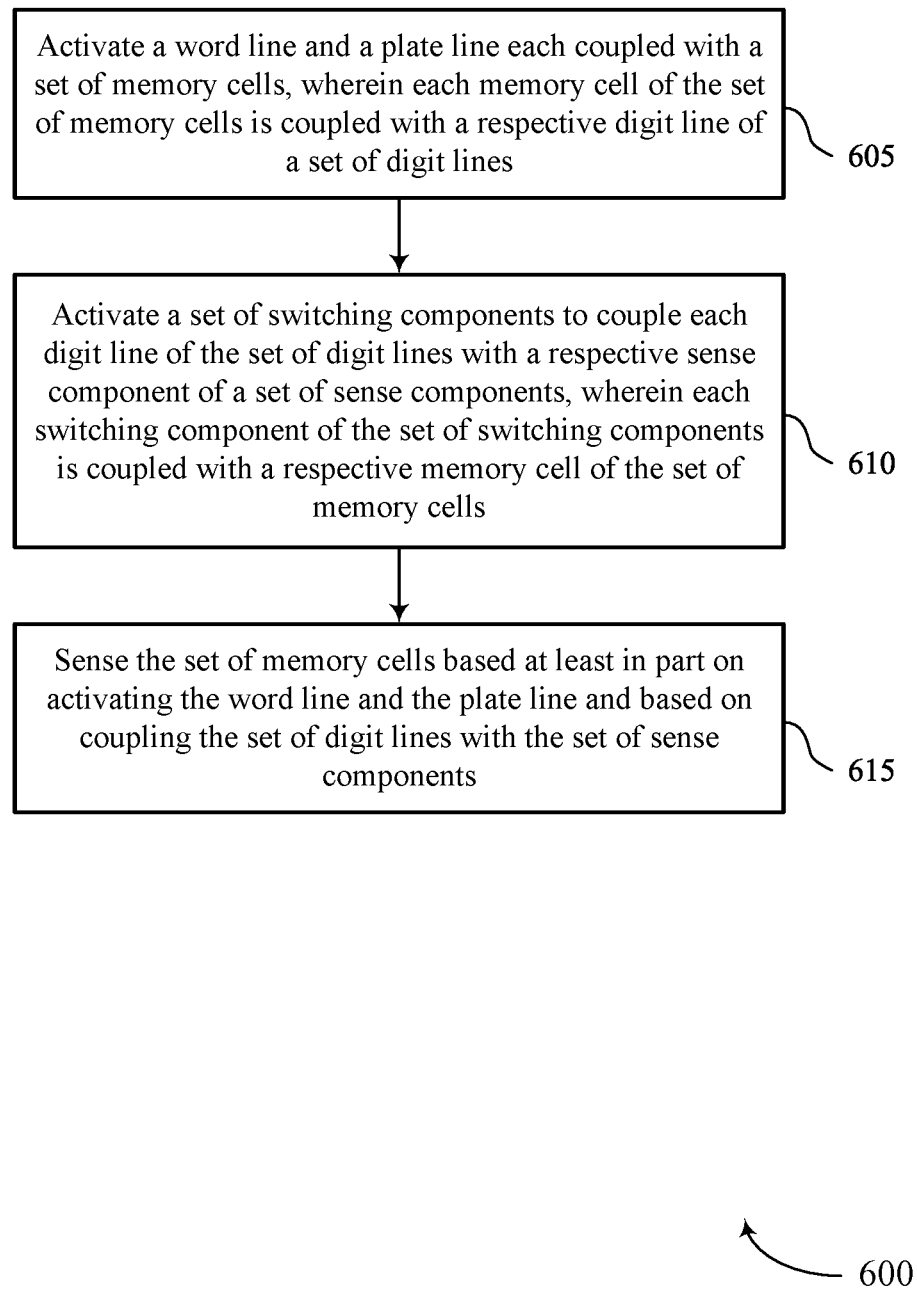
FIG. 6 shows a flowchart illustrating a method or methods that support a sensing scheme for a memory with shared sense components in accordance with examples as disclosed herein.

FIG. 6 shows a flowchart illustrating a method 600 that supports a sensing scheme for a memory with shared sense components in accordance with examples as disclosed herein. The operations of method 600 may be implemented by a device or its components as described herein. For example, the operations of method 600 may be performed by a device as described with reference to FIGS. 1 through 5. In some examples, a device may execute a set of instructions to control the functional elements of the device to perform the described functions. Additionally or alternatively, the device may perform aspects of the described functions using special-purpose hardware.

At 605, the method may include activating a word line and a plate line each coupled with a set of memory cells, where each memory cell of the set of memory cells is coupled with a respective digit line of a set of digit lines. The operations of 605 may be performed in accordance with examples as disclosed herein. In some examples, aspects of the operations of 605 may be performed by a driver circuitry 525 as described with reference to FIG. 5.

At 610, the method may include activating a set of switching components to couple each digit line of the set of digit lines with a respective sense component of a set of sense components, where each switching component of the set of switching components is coupled with a respective memory cell of the set of memory cells. The operations of 610 may be performed in accordance with examples as disclosed herein. In some examples, aspects of the operations of 610 may be performed by a switching component driver 530 as described with reference to FIG. 5.

At 615, the method may include sensing the set of memory cells based at least in part on activating the word line and the plate line and based on coupling the set of digit lines with the set of sense components. The operations of 615 may be performed in accordance with examples as disclosed herein. In some examples, aspects of the operations of 615 may be performed by a sensing circuitry 535 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for activating a word line and a plate line each coupled with a set of memory cells, where each memory cell of the set of memory cells is coupled with a respective digit line of a set of digit lines, activating a set of switching components to couple each digit line of the set of digit lines with a respective sense component of a set of sense components, where each switching component of the set of switching components is coupled with a respective memory cell of the set of memory cells, and sensing the set of memory cells based at least in part on activating the word line and the plate line and based on coupling the set of digit lines with the set of sense components.

In some examples of the method 600 and the apparatus described herein, the set of switching components may be activated concurrent with activating the word line and the plate line.

Some examples of the method 600 and the apparatus described herein may further include operations, features, circuitry, logic, means, or instructions for deactivating the set of switching components to isolate the set of digit lines from the set of sense components based at least in part on sensing the set of memory cells and deactivating the plate line before deactivating the set of switching components.

In some examples of the method 600 and the apparatus described herein, the set of switching components may be deactivated after sensing the set of memory cells and the method, apparatuses, and non-transitory computer-readable medium may include further operations, features, circuitry, logic, means, or instructions for activating, after deactivating the set of switching components, a second plate line coupled with a second set of memory cells, where each memory cell of the second set of memory cells may be coupled with a respective digit line of a second set of digit lines and activating a second set of switching components to couple each digit line of the second set of digit lines with a respective sense component of the set of sense components.

Some examples of the method 600 and the apparatus described herein may further include operations, features, circuitry, logic, means, or instructions for activating a second word line coupled with the second set of memory cells concurrent with activating the word line coupled with the set of memory cells.

Some examples of the method 600 and the apparatus described herein may further include operations, features, circuitry, logic, means, or instructions for activating a second word line coupled with the second set of memory cells after activating the word line coupled with the set of memory cells.

Some examples of the method 600 and the apparatus described herein may further include operations, features, circuitry, logic, means, or instructions for deactivating the second set of switching components to isolate the second set of digit lines from the set of sense components based at least in part on sensing the second set of memory cells and deactivating the second plate line before deactivating the second set of switching components.

In some examples of the method 600 and the apparatus described herein, activating, based at least in part on activating the word line, a second set of switching components coupled with the set of memory cells, where each activated switching component in the second set of switching components couples a respective memory cell of the set of memory cells with a respective digit line of the set of digit lines.

It should be noted that the methods described herein are possible implementations, and that the operations and the steps may be rearranged or otherwise modified and that other implementations are possible. Furthermore, portions from two or more of the methods may be combined.

Another apparatus is described. The apparatus may include a set of memory cells that is coupled with a word line and a plate line, a set of digit lines coupled with the set of memory cells, where each digit line of the set of digit lines is coupled with a respective memory cell of the set of memory cells, and a set of switching components coupled with the set of memory cells and configured to couple the set of digit lines with a set of sense components, where each switching component in the set of switching components is coupled with a respective digit line of the set of digit lines and a respective sense component of the set of sense components In some examples, the apparatus may include a memory array including the plurality of memory cells arranged in a set of memory tiers, where each sense component of the set of sense components may be coupled with a respective set of word lines in a respective tier of the set of tiers.

In some examples, the apparatus may include a second set of memory cells that may be coupled with a second word line and a second plate line, where each memory cell of the second set of memory cells may be coupled with a respective digit line of a second set of digit lines and a second set of switching components coupled with the second set of memory cells and configured to couple the second set of digit lines with the set of sense components.

In some examples, the apparatus may include a second set of memory cells that may be coupled with a second word line and a second plate line, where each memory cell of the second set of memory cells may be coupled with a respective digit line of the set of digit lines.

In some examples, the apparatus may include a word line driver coupled with the set of word lines and configured to activate the set of word lines concurrently.

In some examples, the apparatus may include a word line driver coupled with the set of word lines and configured to activate one or more of the word lines at different times.

In some examples, the apparatus may include a word line driver coupled with the set of word lines, the word line driver disposed below the set of word lines and within a footprint of the memory array.

In some examples, the apparatus may include a word line driver coupled with the set of word lines, the word line driver disposed below the set of word lines and outside a footprint of the memory array.

In some examples, the apparatus may include a second set of switching components coupled with the set of memory cells, where each switching component of the second set of switching components may be configured to couple a respective memory cell of the set of memory cells with a respective digit line of the set of digit lines.

Another apparatus is described. The apparatus may include a set of memory cells that is coupled with a word line and a plate line, where each memory cell of the set of memory cells is coupled with a respective digit line of a set of digit lines, a set of switching components coupled with the set of digit lines and a set of sense components, and a controller configured to cause the apparatus to activate the word line and the plate line each of which is coupled with the set of memory cells, activate a set of switching components to couple each digit line of the set of digit lines with a respective sense component of the set of sense components, and sense the set of memory cells based at least in part on activating the word line and the plate line and based on coupling the set of digit lines with the set of sense components In some examples of the apparatus, the set of switching components may be activated concurrent with activating the word line and the plate line.

In some examples, the apparatus may include deactivate the set of switching components to isolate the set of digit lines from the set of sense components based at least in part on sensing the set of memory cells and deactivate the plate line before deactivating the set of switching components.

In some examples, the apparatus may include activate, after deactivating the set of switching components, a second plate line coupled with a second set of memory cells, where each memory cell of the second set of memory cells may be coupled with a respective digit line of a second set of digit lines and activate a second set of switching components to couple each digit line of the second set of digit lines with a respective sense component of the set of sense components.

In some examples, the apparatus may include activate a second word line coupled with the second set of memory cells concurrent with activating the word line coupled with the set of memory cells.

In some examples, the apparatus may include activate a second word line coupled with the second set of memory cells after activating the word line coupled with the set of memory cells.

In some examples, the apparatus may include deactivate the second set of switching components to isolate the second set of digit lines from the set of sense components based at least in part on sensing the second set of memory cells and deactivate the second plate line before deactivating the second set of switching components.

In some examples of the apparatus, the controller may be further configured to cause the apparatus to activate, based at least in part on activating the word line, a second set of switching components coupled with the set of memory cells, where each activated switching component in the second set of switching components couples a respective memory cell of the set of memory cells with a respective digit line of the set of digit lines.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if a flow of signals between the components is possible in at least one scenario. At any given time, the signal path between components that are in electronic communication with each other (or in conductive contact with or connected with or coupled with) may be an open circuit or a closed circuit based on the operation of the device that includes the connected components. The signal path between connected components may be a direct path between the components or the signal path between connected components may be an indirect path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that establishes a conductive path between the other components so that signals flow between the other components.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic. As used herein, the term "concurrently" means that the described actions or phenomena occur during durations that at least partially overlap in time, that can occur at substantially the same time or be offset in time.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers 15 are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a first switching component configured to couple a first digit line of a first memory cell, in a first tier of memory cells, with an input of a first sense component;
a second switching component configured to couple a second digit line of a second memory cell, in a second tier of memory cells, with an input of a second sense component, the second memory cell coupled with a same word line as the first memory cell and coupled with a same plate line as the first memory cell;
the first sense component configured to sense the first memory cell based at least in part on the first switching component coupling the first digit line with the input of the first sense component; and the second sense component configured to sense, concurrently with the first sense component sensing the first memory cell, the second memory cell based at least in part on the second switching component coupling the second digit line with the input of the second sense component.

2. The apparatus of claim 1, further comprising:
a third switching component configured to couple a third digit line of a third memory cell, in the first tier of memory cells, with the input of the first sense component; and
a fourth switching component configured to couple a fourth digit line of a fourth memory cell, in the second tier of memory cells, with the input of the second sense component.

3. The apparatus of claim 2, wherein the third memory cell and the fourth memory cell are coupled with a second word line different than the word line coupled with the first memory cell and the second memory cell, the apparatus further comprising:
a word line driver coupled with the word line and the second word line, and configured to activate the word line and the second word line concurrently.

4. The apparatus of claim 2, wherein the third memory cell and the fourth memory cell are coupled with a second plate line different than the plate line coupled with the first memory cell and the second memory cell, the apparatus further comprising:
a plate line driver coupled with the plate line and the second plate line, and configured to activate the plate line and the second plate line at different times.

5. The apparatus of claim 2, wherein the first sense component is configured to sense the first memory cell and the third memory cell at different times, and wherein the second sense component is configured to sense the second memory cell and the fourth memory cell at different times.

6. The apparatus of claim 1, further comprising:
a third switching component configured to couple the first memory cell with the first digit line; and
a fourth switching component configured to couple the second memory cell with the second digit line.

7. The apparatus of claim 1, wherein the first switching component is configured to couple a third digit line of a third memory cell, in the first tier of memory cells, with the input of the first sense component, the third memory cell coupled with a second word line different than the word line coupled with the first memory cell.

8. The apparatus of claim 7, wherein the second switching component is configured to couple a fourth digit line of a fourth memory cell, in the second tier of memory cells, with the input of the second sense component, the fourth memory cell coupled with the second word line.

9. The apparatus of claim 8, wherein the third memory cell and the fourth memory cell are coupled with a second plate line different than the plate line coupled with the first memory cell and the second memory cell.

10. A method, comprising:
activating a word line coupled with a first memory cell in a first tier of memory cells and coupled with a second memory cell in a second tier of memory cells, wherein activating the word line couples the first memory cell with a first digit line and couples the second memory cell with a second digit line;
activating a first switching component and a second switching component based at least in part on activating the word line, wherein activating the first switching component couples the first digit line with a first sense component in the first tier, wherein activating the second switching component couples the second digit line with a second sense component in the second tier; and
activating the first sense component to sense the first memory cell and activating the second sense component to sense, concurrently with sensing the first memory cell, the second memory cell.

11. The method of claim 10, wherein the first memory cell and the second memory cell are coupled with a same plate line, the method further comprising:
activating the plate line concurrent with activating the word line.

12. The method of claim 10, wherein the first switching component and the second switching component are activated concurrent with activating the word line.

13. The method of claim 10, further comprising:
coupling, after sensing the first memory cell and the second memory cell, a third memory cell in the first tier with the first sense component in the first tier, and concurrently coupling a fourth memory cell in the second tier with the second sense component in the second tier; and
activating the first sense component and the second sense component to concurrently sense the third memory cell and the fourth memory cell.

14. The method of claim 11, wherein the third memory cell and the fourth memory cell are coupled with a second plate line different than a plate line coupled with the first memory cell and the second memory cell, the method further comprising:
activating the plate line coupled with the first memory cell and the second memory cell before activating the first sense component and the second sense component; and
activating the second plate line coupled with the third memory cell and the fourth memory cell after activating the plate line coupled with the first memory cell and the second memory cell.

15. The method of claim 13, wherein the third memory cell is coupled with the first sense component while the word line is activated, and wherein the fourth memory cell is coupled with the second sense component while the word line is activated, the method further comprising:
deactivating the word line after sensing the third memory cell and the fourth memory cell.

16. An apparatus, comprising:
a memory device comprising a first tier of memory cells and a second tier of memory cells; and
one or more controllers coupled with the memory device and configured to cause the apparatus to:
activate a word line coupled with a first memory cell in the first tier of memory cells and coupled with a second memory cell in the second tier of memory cells, wherein activating the word line couples the first memory cell with a first digit line and couples the second memory cell with a second digit line;
activate a first switching component and a second switching component based at least in part on activating the word line, wherein activating the first switching component couples the first digit line with a first sense component in the first tier, wherein activating the second switching component couples the second digit line with a second sense component in the second tier; and
activate the first sense component to sense the first memory cell and activate the second sense component to sense, concurrently with sensing the first memory cell, the second memory cell.

17. The apparatus of claim 16, wherein the first memory cell and the second memory cell are coupled with a same plate line, and wherein the one or more controllers is further configured to cause the apparatus to:

activate the plate line concurrent with activating the word line.

18. The apparatus of claim 16, wherein the first switching component and the second switching component are activated concurrent with activating the word line.

19. The apparatus of claim 16, wherein the one or more controllers is further configured to cause the apparatus to:

couple, after sensing the first memory cell and the second memory cell, a third memory cell in the first tier with the first sense component in the first tier, and concurrently coupling a fourth memory cell in the second tier with the second sense component in the second tier; and activate the first sense component and the second sense component to concurrently sense the third memory cell and the fourth memory cell.

20. The apparatus of claim 19, wherein the third memory cell and the fourth memory cell are coupled with a second plate line different than a plate line coupled with the first memory cell and the second memory cell, and wherein the one or more controllers is further configured to cause the apparatus to:

activate the plate line coupled with the first memory cell and the second memory cell before activating the first sense component and the second sense component; and activate the second plate line coupled with the third memory cell and the fourth memory cell after activating the plate line coupled with the first memory cell and the second memory cell.

\* \* \* \* \*